United States Patent
Kamijima

(10) Patent No.: US 6,771,463 B2
(45) Date of Patent: Aug. 3, 2004

(54) THIN-FILM COIL AND THIN-FILM MAGNETIC HEAD HAVING TWO PATTERNED CONDUCTOR LAYERS THAT ARE COIL-SHAPED AND STACKED

(75) Inventor: Akifumi Kamijima, Tokyo (JP)

(73) Assignee: TDK Corporation, Tokyo (JP)

( * ) Notice: Subject to any disclaimer, the term of this patent is extended or adjusted under 35 U.S.C. 154(b) by 351 days.

(21) Appl. No.: 09/842,688

(22) Filed: Apr. 27, 2001

(65) Prior Publication Data

US 2002/0021528 A1 Feb. 21, 2002

(30) Foreign Application Priority Data

May 10, 2000 (JP) ........................................ 2000-137754

(51) Int. Cl.⁷ ............................ G11B 5/147; G11B 5/17
(52) U.S. Cl. ...................................... 360/123; 360/126
(58) Field of Search ................................. 360/123, 126

(56) References Cited

U.S. PATENT DOCUMENTS

| | | | | |
|---|---|---|---|---|
| 3,853,715 A | | 12/1974 | Romankiw | 204/15 |
| 4,190,872 A | | 2/1980 | Jones, Jr. et al. | 360/125 |
| 4,416,056 A | * | 11/1983 | Takahashi | 29/603.24 |
| 4,713,711 A | | 12/1987 | Jones, Jr. et al. | 360/123 |
| 5,124,870 A | * | 6/1992 | Toyoda | 360/126 |
| 5,170,302 A | * | 12/1992 | Matsumoto | 360/123 |
| 5,465,475 A | * | 11/1995 | Kinoshita et al. | 29/603.16 |
| 6,204,997 B1 | * | 3/2001 | Sasaki | 360/123 |
| 6,204,998 B1 | * | 3/2001 | Katz | 360/123 |
| 6,320,726 B1 | * | 11/2001 | Sasaki | 360/126 |
| 6,381,095 B1 | * | 4/2002 | Sin et al. | 360/126 |
| 6,400,525 B1 | * | 6/2002 | Sasaki et al. | 360/123 |
| 6,466,401 B1 | * | 10/2002 | Hong et al. | 360/123 |
| 6,496,330 B1 | | 12/2002 | Crue, Jr. et al. | 360/123 |
| 6,507,456 B1 | * | 1/2003 | Dinan et al. | 360/123 |
| 6,515,826 B1 | * | 2/2003 | Hsiao et al. | 360/126 |
| 6,525,901 B1 | * | 2/2003 | Kamijima et al. | 360/123 |
| 6,570,739 B2 | * | 5/2003 | Hsiao et al. | 360/123 |
| 6,683,750 B2 | * | 1/2004 | Sato | 360/126 |

FOREIGN PATENT DOCUMENTS

| | | |
|---|---|---|
| JP | A 55-84019 | 6/1980 |
| JP | B2 56-36706 | 8/1981 |
| JP | A-60-254403 | 12/1985 |
| JP | A 61-255523 | 11/1986 |
| JP | A 63-204504 | 8/1988 |
| JP | A-2-126610 | 5/1990 |
| JP | A 6-215329 | 8/1994 |

* cited by examiner

Primary Examiner—Brian E. Miller
(74) Attorney, Agent, or Firm—Oliff & Berridge, PLC

(57) ABSTRACT

A thin-film magnetic head comprises a read head and a write head. The write head incorporates: a bottom pole layer and a top pole layer (made up of a pole portion layer, a magnetic layer and a yoke portion layer); a write gap layer located between pole portions of these two pole layers; and a thin-film coil at least a part of which is located between the two pole layers and insulated therefrom. The thin-film coil includes a first layer and a second layer between which the write gap layer is located. One of ends of the first layer is connected to one of ends of the second layer. The other of the ends of the first layer is connected to the other of the ends of the second layer, too.

4 Claims, 7 Drawing Sheets

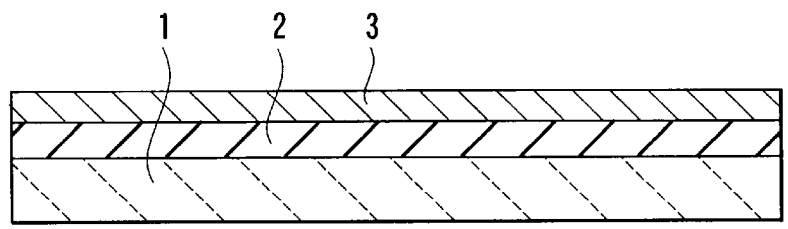 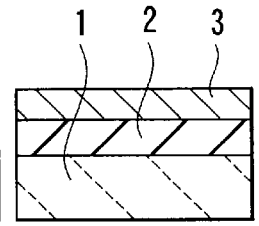
FIG. 1A  FIG. 1B
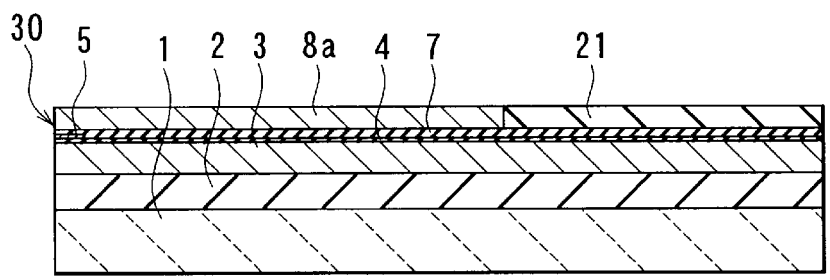 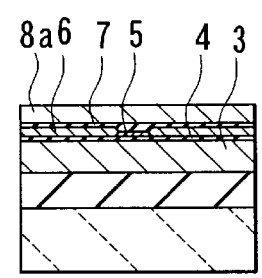
FIG. 2A  FIG. 2B
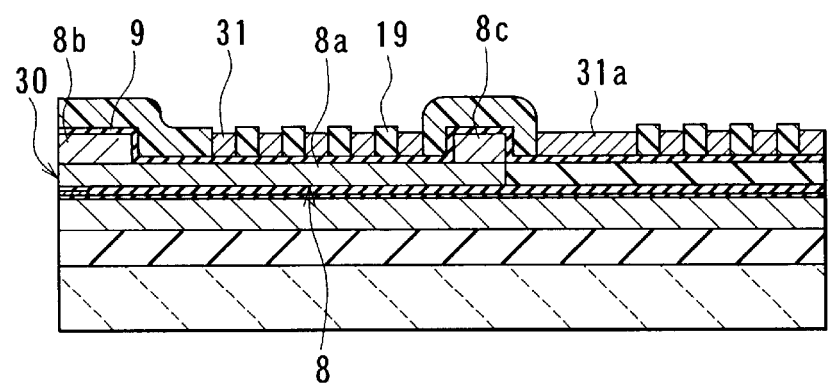 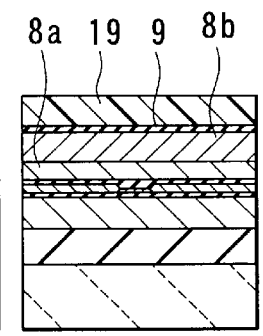
FIG. 3A  FIG. 3B

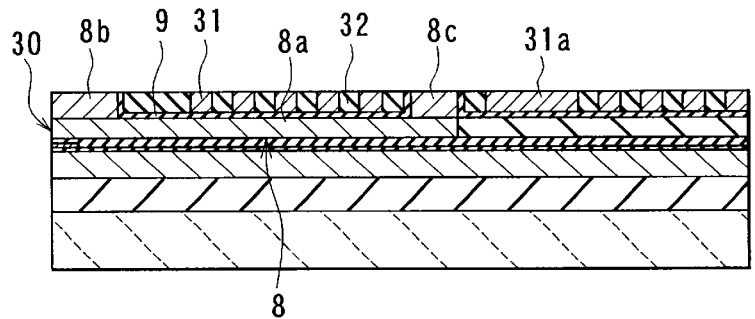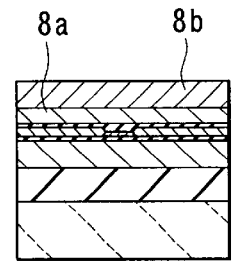
FIG. 4A    FIG. 4B
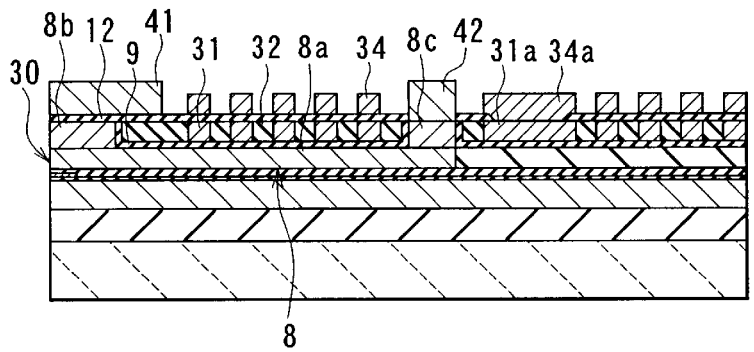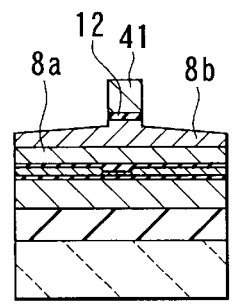
FIG. 5A    FIG. 5B
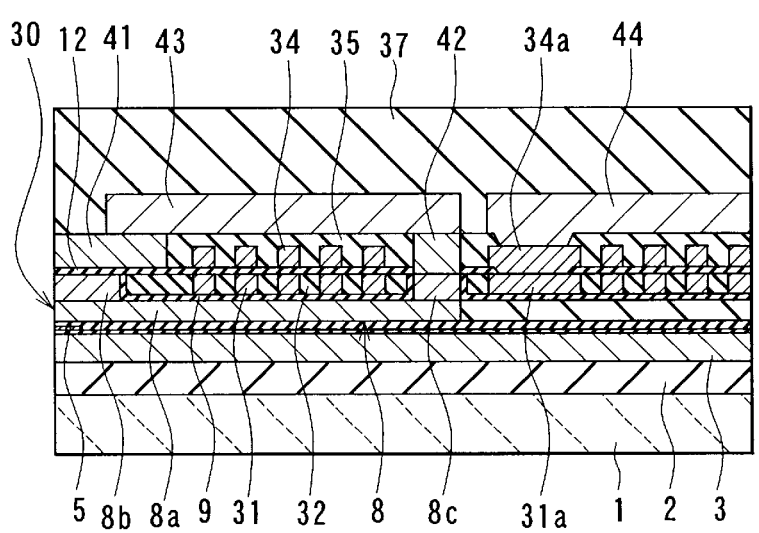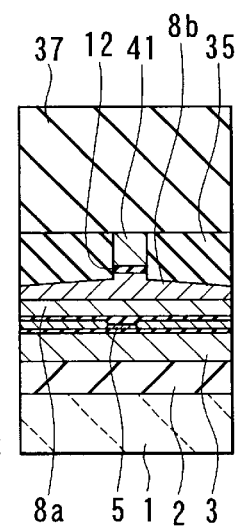
FIG. 6A    FIG. 6B

THIN-FILM COIL AND THIN-FILM MAGNETIC HEAD HAVING TWO PATTERNED CONDUCTOR LAYERS THAT ARE COIL-SHAPED AND STACKED

BACKGROUND OF THE INVENTION

1. Field of the Invention

The present invention relates to a thin-film coil that is incorporated in a thin-film magnetic head and so on and a method of manufacturing such a thin-film coil, and to a thin-film magnetic head incorporating a thin-film coil and a method of manufacturing such a thin-film magnetic head.

2. Description of the Related Art

Performance improvements in thin-film magnetic heads have been sought as areal recording density of hard disk drives has increased. Such thin-film magnetic heads include composite thin-film magnetic heads that have been widely used. A composite head is made of a layered structure including a write (recording) head having an induction-type electromagnetic transducer for writing and a read (reproducing) head having a magnetoresistive (that may be hereinafter called MR) element for reading.

The induction-type electromagnetic transducer of the above-mentioned thin-film magnetic head incorporates a thin-film coil. In terms of the number of layers of the coil, there are coils made up of one layer, such as the one disclosed in Published Unexamined Japanese Patent Application Showa 55-84019 (1980), coils made up of two layers, such as the one disclosed in Published Unexamined Japanese Patent Application Showa 61-255523 (1986), and coils made up of three layers or more. There are thin-film coils having a variety of designs, such as those having different numbers of turns, pitches of turns (hereinafter called a coil pitch), and coil thicknesses, in addition to the different numbers of layers.

In the prior-art coils having a plurality of layers, the layers are connected in series, regardless of the number of layers.

As areal recording density of hard disk drives has increased, an improvement in writing rate and a reduction in track width of the write head have been sought.

In order to make a thin-film magnetic head that achieves a high writing rate, the inductance of the write head is required to be reduced. To achieve this, a reduction in magnetic path length (yoke length) is required.

As the track width has been reduced, an improvement in the writing capability of the write head in a high frequency region has been required. One of the factors that determine the writing capability is the number of turns of the coil. The greater the number of turns, the higher the writing capability.

A reduction in coil pitch is required to satisfy both of the above-mentioned two requirements, that is, a reduction in inductance of the write head and an increase in the number of turns.

However, if the coil pitch is reduced while the coil thickness is kept constant, the cross-sectional area of the coil is reduced. As a result, the resistance of the coil is increased. Consequently, the coil produces heat, which results in electromigration and may cause a break in the coil.

To solve this problem, the coil pitch may be reduced and the coil thickness may be increased. Since the coil is generally formed through frame plating, the thickness of the resist frame is required to be increased, too, so as to increase the coil thickness. However, it is difficult to form a fine resist frame by patterning a thick resist layer. It is therefore difficult in prior art to form a thick coil whose coil pitch is small.

In Published Unexamined Japanese Patent Application Heisei 6-215329 (1994), a technique is disclosed for making a fine patterned conductor layer. According to this technique, a patterned resist is formed on the top surface of an insulating layer. A first etching step is then performed to etch the insulating layer downward, based on the shape of the patterned resist. A second etching step is further performed to etch at least a portion near the upper end of the sidewall of the trench portion formed through etching of the insulating layer. The second etching is performed toward sides of the portion near the upper end. An overhang portion is thereby formed at the lower edge of the patterned resist. A conductor is deposited on the overhang portion to form a conductor film. A portion of the conductor film located on the top surface of the patterned resist is lifted off. The fine patterned conductor layer is thus formed.

However, even if a coil is formed through this technique, it is difficult to greatly increase the thickness of a one-layer coil.

It is possible that a patterned thin film for a coil is formed through frame plating, and on this film another patterned thin film having the same design is formed through frame plating, so as to increase the coil thickness. However, it is difficult to form the other fine patterned thin film on the fine patterned thin film with accuracy, and it is difficult to align the two upper and lower patterned thin films.

In Published Unexamined Japanese Patent Application Showa 63-204504 (1988), a technique is disclosed for making a coil in which a plurality of patterned low-resistance films are stacked. According to this technique, a first low-resistance film, a metal protection film, and a second low-resistance film are stacked one by one on an insulating layer. The second low-resistance film is photo-etched to form a coil pattern. Side protection films are then formed on side faces of the patterned second low-resistance film. The first low-resistance film is then etched. The coil is thus formed.

However, although this technique is capable of preventing the promotion of side etching of the side faces of the patterned second low-resistance film after the side protection films are formed, it is not capable of preventing side etching itself when each of the low-resistance films is etched. Therefore, it is difficult to greatly reduce the coil dimensions through this technique.

OBJECTS AND SUMMARY OF THE INVENTION

It is a first object of the invention to provide a thin-film coil that has a small coil pitch and a large cross-sectional area and that is easily fabricated, and a method of manufacturing such a thin-film coil.

It is a second object of the invention to provide a thin-film magnetic head incorporating a thin-film coil that has a small coil pitch and a large cross-sectional area and that is easily fabricated, and a method of manufacturing such a thin-film magnetic head.

A first thin-film coil of the invention comprises: a first patterned conductor layer and a second patterned conductor layer that are coil-shaped and stacked; an insulating layer located between the first and second patterned conductor layers; a first connecting portion connecting one of ends of the first patterned conductor layer to one of ends of the second patterned conductor layer; and a second connecting portion connecting the other of the ends of the first patterned conductor layer to the other of the ends of the second patterned conductor layer.

A first method of manufacturing a thin-film coil of the invention comprises the steps of: forming a coil-shaped first patterned conductor layer; forming an insulating layer on the first patterned conductor layer; and forming a coil-shaped second patterned conductor layer on the insulating layer, and connecting one of ends of the first patterned conductor layer to one of ends of the second patterned conductor layer, and connecting the other of the ends of the first patterned conductor layer to the other of the ends of the second patterned conductor layer.

According to the first thin-film coil or the method of manufacturing the same of the invention, the insulating layer is located between the first and second patterned conductor layers. The first connecting portion connects one of the ends of the first patterned conductor layer to one of the ends of the second patterned conductor layer. The second connecting portion connects the other of the ends of the first patterned conductor layer to the other of the ends of the second patterned conductor layer. Therefore, the first and second patterned conductor layers are connected in parallel.

According to the first method of manufacturing the thin-film coil of the invention, the first and second patterned conductor layers may be formed through frame plating.

A second thin-film coil of the invention comprises: a coil-shaped first patterned conductor layer; a coil insulating layer that insulates turns of the first patterned conductor layer from one another and that is flattened together with one of surfaces of the first patterned conductor layer; and a coil-shaped second patterned conductor layer located to touch the one of the surfaces of the first patterned conductor layer.

A second method of manufacturing a thin-film coil of the invention comprises the steps of: forming a coil-shaped first patterned conductor layer; forming a coil insulating layer that insulates turns of the first patterned conductor layer from one another and that is flattened together with one of surfaces of the first patterned conductor layer; and forming a coil-shaped second patterned conductor layer located to touch the one of the surfaces of the first patterned conductor layer.

According to the second thin-film coil or the method of manufacturing the same of the invention, the coil insulating layer that insulates the turns of the first patterned conductor layer from one another is flattened together with one of the surfaces of the first patterned conductor layer. The second patterned conductor layer is located to touch the one of the surfaces of the first patterned conductor layer.

According to the second method of manufacturing the thin-film coil of the invention, the first and second patterned conductor layers may be formed through frame plating.

A first thin-film magnetic head of the invention comprises: a medium facing surface that faces toward a recording medium; a first magnetic layer and a second magnetic layer magnetically coupled to each other and including magnetic pole portions that are opposed to each other and placed in regions of the magnetic layers on a side of the medium facing surface, each of the magnetic layers including at least one layer; a gap layer provided between the pole portions of the first and second magnetic layers; and a thin-film coil at least a part of which is placed between the first and second magnetic layers, the at least part of the coil being insulated from the first and second magnetic layers. The thin-film coil incorporates: a first patterned conductor layer and a second patterned conductor layer that are coil-shaped and stacked; an insulating layer located between the first and second patterned conductor layers; a first connecting portion connecting one of ends of the first patterned conductor layer to one of ends of the second patterned conductor layer; and a second connecting portion connecting the other of the ends of the first patterned conductor layer to the other of the ends of the second patterned conductor layer.

A first method of the invention is provided for manufacturing a thin-film magnetic head comprising: a medium facing surface that faces toward a recording medium; a first magnetic layer and a second magnetic layer magnetically coupled to each other and including magnetic pole portions that are opposed to each other and placed in regions of the magnetic layers on a side of the medium facing surface, each of the magnetic layers including at least one layer; a gap layer provided between the pole portions of the first and second magnetic layers; and a thin-film coil at least a part of which is placed between the first and second magnetic layers, the at least part of the coil being insulated from the first and second magnetic layers. The method comprises the steps of forming the first magnetic layer; forming the gap layer on the first magnetic layer; forming the second magnetic layer on the gap layer; and forming the thin-film coil such that the at least part thereof is placed between the first and second magnetic layers, the at least part of the coil being insulated from the first and second magnetic layers. The step of forming the coil includes the steps of: forming a coil-shaped first patterned conductor layer; forming an insulating layer on the first patterned conductor layer; and forming a coil-shaped second patterned conductor layer on the insulating layer, and connecting one of ends of the first patterned conductor layer to one of ends of the second patterned conductor layer, and connecting the other of the ends of the first patterned conductor layer to the other of the ends of the second patterned conductor layer.

According to the first thin-film magnetic head or the method of manufacturing the same of the invention, the insulating layer is located between the first and second patterned conductor layers. The first connecting portion connects one of the ends of the first patterned conductor layer to one of the ends of the second patterned conductor layer. The second connecting portion connects the other of the ends of the first patterned conductor layer to the other of the ends of the second patterned conductor layer. Therefore, the first and second patterned conductor layers are connected in parallel.

According to the first method of manufacturing the thin-film magnetic head of the invention, the first and second patterned conductor layers may be formed through frame plating.

A second thin-film magnetic head of the invention comprises: a medium facing surface that faces toward a recording medium; a first magnetic layer and a second magnetic layer magnetically coupled to each other and including magnetic pole portions that are opposed to each other and placed in regions of the magnetic layers on a side of the medium facing surface, each of the magnetic layers including at least one layer; a gap layer provided between the pole portions of the first and second magnetic layers; and a thin-film coil at least a part of which is placed between the first and second magnetic layers, the at least part of the coil being insulated from the first and second magnetic layers. The thin-film coil incorporates: a coil-shaped first patterned conductor layer; a coil insulating layer that insulates turns of the first patterned conductor layer from one another and that is flattened together with one of surfaces of the first patterned conductor layer; and a coil-shaped second patterned conductor layer located to touch the one of the surfaces of the first patterned conductor layer.

A second method of the invention is provided for manufacturing a thin-film magnetic head comprising: a medium facing surface that faces toward a recording medium; a first magnetic layer and a second magnetic layer magnetically coupled to each other and including magnetic pole portions that are opposed to each other and placed in regions of the magnetic layers on a side of the medium facing surface, each of the magnetic layers including at least one layer; a gap layer provided between the pole portions of the first and second magnetic layers; and a thin-film coil at least a part of which is placed between the first and second magnetic layers, the at least part of the coil being insulated from the first and second magnetic layers. The method comprises the steps of: forming the first magnetic layer; forming the gap layer on the first magnetic layer; forming the second magnetic layer on the gap layer; and forming the thin-film coil such that the at least part thereof is placed between the first and second magnetic layers, the at least part of the coil being insulated from the first and second magnetic layers. The step of forming the coil includes the steps of: forming a coil-shaped first patterned conductor layer; forming a coil insulating layer that insulates turns of the first patterned conductor layer from one another and that is flattened together with one of surfaces of the first patterned conductor layer; and forming a coil-shaped second patterned conductor layer located to touch the one of the surfaces of the first patterned conductor layer.

According to the second thin-film magnetic head or the method of manufacturing the same of the invention, the coil insulating layer that insulates the turns of the first patterned conductor layer from one another is flattened together with one of the surfaces of the first patterned conductor layer. The second patterned conductor layer is located to touch the one of the surfaces of the first patterned conductor layer.

According to the second method of manufacturing the thin-film magnetic head of the invention, the first and second patterned conductor layers may be formed through frame plating.

Other and further objects, features and advantages of the invention will appear more fully from the following description.

BRIEF DESCRIPTION OF THE DRAWINGS

FIG. 1A and FIG. 1B are cross sections for illustrating a step of a method of manufacturing a thin-film magnetic head of a first embodiment of the invention.

FIG. 2A and FIG. 2B are cross sections for illustrating a step that follows FIG. 1A and FIG. 1B.

FIG. 3A and FIG. 3B are cross sections for illustrating a step that follows FIG. 2A and FIG. 2B.

FIG. 4A and FIG. 4B are cross sections for illustrating a step that follows FIG. 3A and FIG. 3B.

FIG. 5A and FIG. 5B are cross sections for illustrating a step that follows FIG. 4A and FIG. 4B.

FIG. 6A and FIG. 6B are cross sections of the thin-film magnetic head of the first embodiment.

DETAILED DESCRIPTION OF THE PREFERRED EMBODIMENTS

Figure 7:
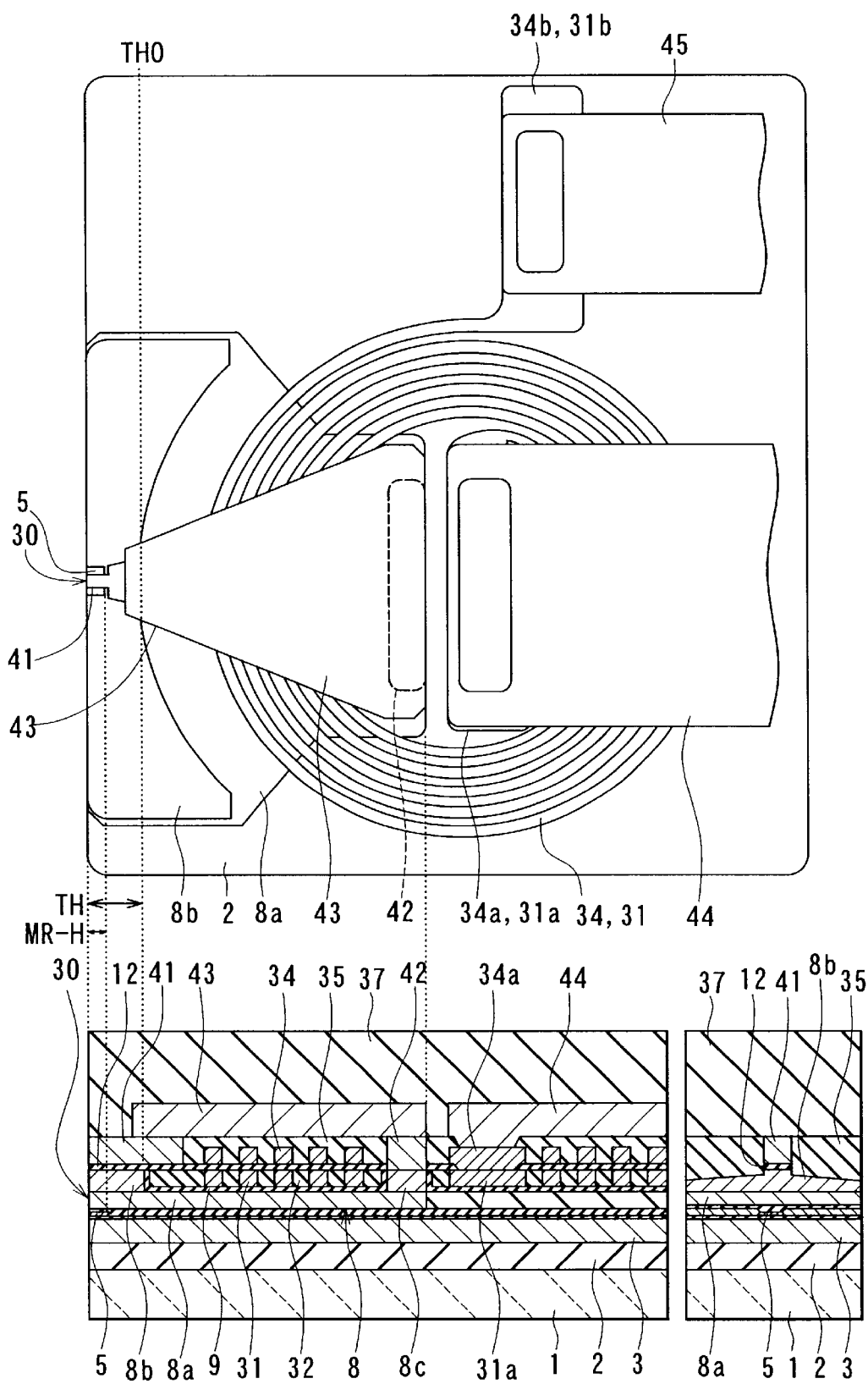
FIG. 7 illustrates the relationship between a top view of the main part of the thin-film magnetic head of the first embodiment and a cross-sectional view thereof

Preferred embodiments of the invention will now be described in detail with reference to the accompanying drawings.

[First Embodiment]

Reference is now made to FIG. 1A to FIG. 6A and FIG. 1B to FIG. 6B to describe a thin-film coil and a method of manufacturing the same, and a thin-film magnetic head and a method of manufacturing the same of a first embodiment of the invention. FIG. 1A to FIG. 6A are cross sections each orthogonal to the air bearing surface. FIG. 1B to FIG. 6B are cross sections of the pole portion each parallel to the air bearing surface.

In the method of manufacturing the thin-film magnetic head of the embodiment, as shown in FIG. 1A and FIG. 1B, an insulating layer 2 made of alumina ($Al_2O_3$), for example, whose thickness is about 5 $\mu$m, is deposited on a substrate 1 made of aluminum oxide and titanium carbide ($Al_2O_3$-TiC), for example. On the insulating layer 2 a bottom shield layer 3 made of a magnetic material such as Permalloy and having a thickness of about 3 $\mu$m is formed for making a read head. The bottom shield layer 3 is formed through plating selectively on the insulating layer 2, using a photoresist film as a mask, for example. Next, although not shown, an insulating layer of alumina, for example, having a thickness of 4 to 5 $\mu$m, for example, is formed over the entire surface. This insulating layer is polished through chemical mechanical polishing (CMP), for example, so that the bottom shield layer 3 is exposed, and the surface is flattened.

Next, as shown in FIG. 2A and FIG. 2B, on the bottom shield layer 3, a bottom shield gap film 4 having a thickness of about 20 to 40 nm, for example, is formed as an insulating film. On the bottom shield gap film 4, an MR element 5 for reading having a thickness of tens of nanometers is formed. The MR element 5 may be fabricated through selectively etching an MR film formed through sputtering. The MR element 5 may be an element made of a magnetosensitive film exhibiting a magnetoresistivity, such as an AMR element, a GMR element, or a tunnel magnetoresistive (TMR) element. Next, on the bottom shield gap film 4, a pair of electrode layers 6 having a thickness of tens of nanometers are formed. The electrode layers 6 are electrically connected to the MR element 5. Next, a top shield gap film 7 having a thickness of about 20 to 40 nm, for example, is formed as an insulating film on the bottom shield gap film 4 and the MR element 5. The MR element 5 is embedded in the shield gap films 4 and 7. An insulating material used for the shield gap films 4 and 7 may be any of alumina, aluminum nitride, diamond-like carbon (DLC), and so on. The shield gap films 4 and 7 may be fabricated through sputtering or chemical vapor deposition (CVD) using trimethyl aluminum (Al(CH$_3$)$_3$) and H$_2$O, for example. Through the use of CVD, it is possible to make the thin and closely packed shield gap films 4 and 7 with few pinholes.

Next, on the top shield gap film 7, a first portion 8a of a top-shield-layer-cum-bottom-pole-layer (called a bottom pole layer in the following description) 8 is selectively formed. The first portion 8a has a thickness of about 1.0 to 1.5 μm. The bottom pole layer 8 is made of a magnetic material and used for both read head and write head. The bottom pole layer 8 is made up of the first portion 8a and a second portion 8b and a third portion 8c that will be described later. The first portion 8a is located to face toward at least a part of a thin-film coil described later.

Next, an insulating layer 21 of alumina, for example, having a thickness of about 3 to 4 μm, is formed over the entire surface. The insulating layer 21 is polished through CMP, for example, so that the first portion 8a of the bottom pole layer 8 is exposed, and the surface is flattened.

Next, as shown in FIG. 3A and FIG. 3B, the second portion 8b and the third portion 8c of the bottom pole layer 8 are formed on the first portion 8a. Each of the second portion 8b and the third portion 8c has a thickness of about 1.5 to 2.5 μm. The second portion 8b makes up the pole portion of the bottom pole layer 8, and is connected to a surface of the first portion 8a that faces toward the thin-film coil (that is, the upper side of FIG. 3A). The third portion 8c is a portion provided for connecting the first portion 8a to a top pole layer described later. The throat height is defined by the position of an end of a portion of the second portion 8b that faces toward the top pole layer, this end being farther from the air bearing surface 30. The position of this end is the zero throat height level. The throat height is the length (height) of the pole portions, that is, the portions of the two pole layers opposed to each other, the write gap layer being located in between, the length from an end of the air bearing surface 30 to the other end. The zero throat height level is the level of the end of the pole portions that is farther from the air bearing surface 30.

The second portion 8b and the third portion 8c of the bottom pole layer 8 may be made of NiFe (80 weight % Ni and 20 weight % Fe), or NiFe (45 weight % Ni and 55 weight % Fe) that is a high saturation flux density material, and may be formed through plating, or may be made of a material such as FeN or FeZrN that is a high saturation flux density material, and may be formed through sputtering. Alternatively, a material such as CoFe or a Co-base amorphous material that is a high saturation flux density material may be used.

Next, an insulating film 9 of alumina, for example, having a thickness of about 0.3 to 0.6 μm, is formed over the entire surface.

Next, a photoresist is patterned through a photolithography process to form a frame 19 used for making a first layer 31 of the thin-film coil through frame plating. Using the frame 19, the first layer 31 of the coil made of copper (Cu), for example, is formed by frame plating. For example, the thickness of the first layer 31 is about 1.0 to 2.0 μm and the coil pitch is 0.5 to 2.0 μm. The first layer 31 is coil-shaped and corresponds to the first patterned conductor layer of the invention. The frame 19 is then removed. In the accompanying drawings numeral 31a indicates a connecting portion that is located at one of the ends of the first layer 31 of the coil. The connecting portion 31a is connected to a connecting portion 34a that is located at one of the ends of a second layer 34 of the coil described later, and to a lead 44 that is a conductive layer.

Next, as shown in FIG. 4A and FIG. 4B, a coil insulating layer 32 of alumina, for example, having a thickness of about 3 to 4 μm is formed over the entire surface. The insulating layer 32 is then polished through CMP, for example, so that the second portion 8b and the third portion 8c of the bottom pole layer 8 are exposed, and the surface is flattened. The coil insulating layer 32 insulates the turns of the first layer 31 of the coil from one another. Although the first layer 31 is exposed in FIG. 4A and FIG. 4B, the first layer 31 may not be exposed.

Next, as shown in FIG. 5A and FIG. 5B, a write gap layer 12 made of an insulating material and having a thickness of 0.2 to 0.3 μm, for example, is formed over the second portion 8b and the third portion 8c of the bottom pole layer 8 that have been exposed and the coil insulating layer 32.

Next, a portion of the gap layer 12 located on the third portion 8c of the bottom pole layer 8 is etched to form a contact hole for making the magnetic path. Portions of the gap layer 12 and the coil insulating layer 32 located on the connecting portion 31a of the first layer 31 of the coil are etched to form another contact hole.

Next, a pole portion layer 41 that has a thickness of 2 to 3 μm, for example, and makes up the pole portion of the top pole layer is formed on the write gap layer 12. A magnetic layer 42 having a thickness of 2 to 3 μm is formed in the portion where the contact hole formed in the portion on the third portion 8c of the bottom pole layer 8 is located. The magnetic layer 42 is a portion provided for connecting a yoke portion layer 43 of the top pole layer described later to the bottom pole layer 8. According to this embodiment, the length of the pole portion layer 41 from an end closer to the air bearing surface 30 to the other end is equal to or greater than the length of the portion of the second portion 8b that defines the throat height from an end of this portion closer to the air bearing surface 30 to the other end.

The pole portion layer 41 and the magnetic layer 42 of the top pole layer may be made of NiFe (80 weight % Ni and 20 weight % Fe), or NiFe (45 weight % Ni and 55 weight % Fe) that is a high saturation flux density material, and may be formed through plating, or may be made of a material such as FeN or FeZrN that is a high saturation flux density material, and may be formed through sputtering. Alternatively, a material such as CoFe or a Co-base amorphous material that is a high saturation flux density material may be used.

Next, the write gap layer 12 is selectively etched through dry etching, using the pole portion layer 41 of the top pole layer as a mask. This dry etching may be reactive ion etching (RIE) using a chlorine-base gas such as BCl$_2$ or Cl$_2$, or a fluorine-base gap such as CF$_4$ or SF$_6$, for example. Next, the second portion 8b of the bottom pole layer 8 is selectively etched by about 0.3 to 0.6 μm through argon ion milling, for example. A trim structure as shown in FIG. 5B is thus formed.

Next, the second layer 34 of the coil made of copper, for example, is formed by frame plating. For example, the thickness of the second layer 34 is about 1.0 to 2.0 μm and the coil pitch is 0.5 to 2.0 μm. The second layer 34 is coil-shaped and has a design similar to that of the first layer 31, and corresponds to the second patterned conductor layer of the invention. In the accompanying drawings numeral 34a indicates the connecting portion that is located at one of the ends of the second layer 34 of the coil. The connecting portion 34a is connected to the connecting portion 31a that is located at one of the ends of the first layer 31 of the coil, and to the lead 44.

According to this embodiment, the write gap layer 12 is located between the first layer 31 that is the first patterned conductor layer and the second layer 34 that is the second patterned conductor layer. The write gap layer 12 corresponds to the insulating layer of the invention located between the first patterned conductor layer and the second patterned conductor layer.

Next, as shown in FIG. 6A and FIG. 6B, an insulating layer 35 of alumina, for example, having a thickness of about 3 to 4 μm is formed over the entire surface. The insulating layer 35 is then polished through CMP, for example, so that the pole portion layer 41 and the magnetic layer 42 of the top pole layer are exposed, and the surface is flattened. Although the second layer 34 is not exposed in FIG. 6A and FIG. 6B, the second layer 34 may be exposed. If the second layer 34 is exposed, another insulating layer is formed on the second layer 34 and the insulating layer 35. A portion of the insulating layer 35 located on the connecting portion 34a of the second layer 34 is etched to form a contact hole.

Next, the yoke portion layer 43 that makes up the yoke portion of the top pole layer is formed for the write head on the pole portion layer 41 and the magnetic layer 42 of the top pole layer that have been flattened, and the insulating layer 35. The yoke portion layer 43 is made of a magnetic material and has a thickness of about 2 to 3 μm, for example. The yoke portion layer 43 is in contact with and magnetically coupled to the third portion 8c of the bottom pole layer 8 through the magnetic layer 42. The yoke portion layer 43 may be made of NiFe (80 weight % Ni and 20 weight % Fe), or NiFe (45 weight % Ni and 55 weight % Fe) that is a high saturation flux density material, and may be formed through plating, or may be made of a material such as FeN or FeZrN that is a high saturation flux density material, and may be formed through sputtering. Alternatively, a material such as CoFe or a Co-base amorphous material that is a high saturation flux density material may be used. To improve the high frequency characteristics, the yoke portion layer 43 may be made of layers of inorganic insulating films and magnetic layers of Permalloy, for example.

According to this embodiment, the yoke portion layer 43 has an end face facing toward the air bearing surface 30 that is located at a distance from the air bearing surface 30 (that is, on the right side of FIG. 6A).

Next, the lead 44 made of copper, for example, is formed through a method such as frame plating on the insulating layer 35 including the portion located on the connecting portion 34a.

Next, an overcoat layer 37 of alumina, for example, having a thickness of 20 to 40 μm is formed over the entire surface. The surface of the overcoat layer 37 is flattened and pads (not shown) for electrodes are formed on the overcoat layer 37. Finally, lapping of the slider is performed to form the air bearing surface 30 of the thin-film magnetic head including the write head and the read head. The thin-film magnetic head of the embodiment is thus completed.

FIG. 7 illustrates the relationship between a top view (the upper view of FIG. 7) of the main part of the thin-film magnetic head of the embodiment and a cross-sectional view (the lower view of FIG. 7) thereof. The overcoat later 37 and the other insulating layers and films are omitted in the top view of FIG. 7. TH indicates the throat height, TH0 indicates the zero throat height level, and MR-H indicates the MR height in FIG. 7. The MR height is the length (height) of the MR element 5 from an end closer to the air bearing surface 30 and the other end.

As shown in FIG. 7, the connecting portions 31b and 34b are provided at the other end of the first layer 31 of the coil and the other end of the second layer 34 of the coil, respectively. The portions 31b and 34b are connected to each other and connected to a lead 45.

In this embodiment the bottom pole layer 8 corresponds to the first magnetic layer of the invention. The top pole layer made up of the pole portion layer 41, the magnetic layer 42 and the yoke portion layer 43 corresponds to the second magnetic layer of the invention.

Reference is now made to FIG. 8 to FIG. 12 to briefly describe frame plating used for making the first layer 31 and the second layer 34 of the thin-film coil. Frame plating is a method of making a patterned plating film through the use of a frame formed by patterning a resist, as disclosed in Published Examined Japanese Patent Application Showa 56-36706 (1981).

Figure 8:
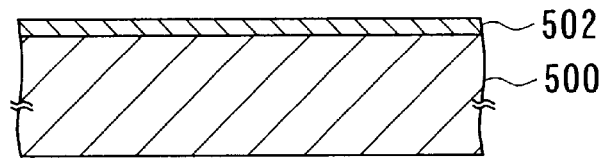
FIG. 8 is a cross section for illustrating a step of an example of method of forming a plating film through the use of frame plating.

FIG. 8 is a cross-sectional view that illustrates a step of an example of method of forming a plating film through the use of frame plating. According to the frame plating, as shown in FIG. 8, an electrode film 502 is formed on an insulating substrate 500, for example, through sputtering or vapor deposition. Below the electrode film 502, an adhesive layer made of a film of chrome (Cr) or titanium (Ti), for example, may be formed so as to increase the adhesion of the electrode film 502 and the substrate 500 to each other. Although it is acceptable that the electrode film 502 is made of a conductive material, the electrode film 502 is preferably made of a metal material the same as the one to be plated.

Figure 9:
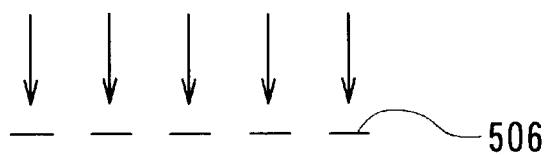
FIG. 9 is a cross section for illustrating a step that follows FIG. 8.
Figure 9:
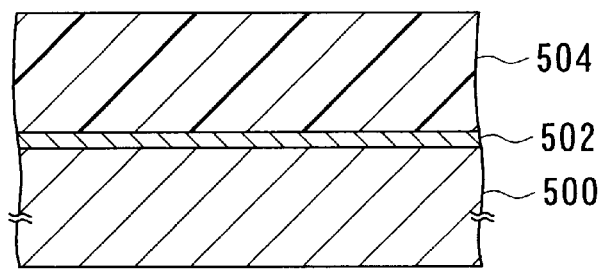

Next, as shown in FIG. 9, a resist is applied to the entire surface to form a resist later 504. Prebaking of the resist layer 504 is performed, if necessary. Next, exposure beams are applied through a mask 506 having a specific pattern to expose the resist layer 504.

Figure 10:
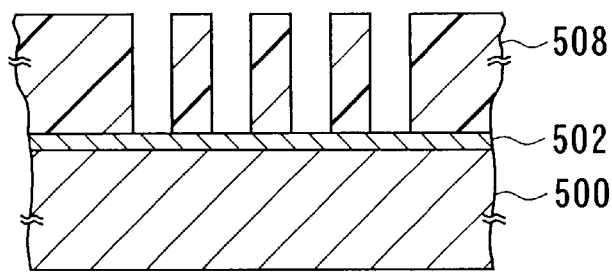
FIG. 10 is a cross section for illustrating a step that follows FIG. 9.

Next, heat treatment is performed, if necessary. Development using an alkaline developer is then performed. The alkaline developer may be 2.38 weight % of tetramethylammoniumhydroxide (TMAH). The developer remaining in the resist layer 504 is cleaned with a washing liquid, and the developing and dissolving reaction of the resist layer 504 is stopped. A resist frame 508 having a specific pattern is thus formed, as shown in FIG. 10.

Figure 11:
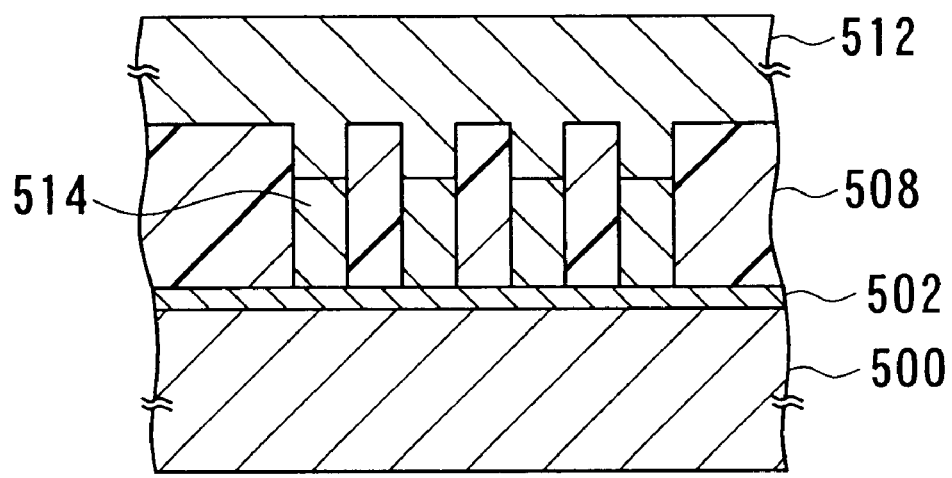
FIG. 11 is a cross section for illustrating a step that follows FIG. 10.

Next, as shown in FIG. 11, the substrate 500 is soaked in a plating solution 512 in a plating bath to perform plating using the resist frame 508 as a frame. A plating film 514 is thus formed in the spaces of the resist frame 508.

Figure 12:
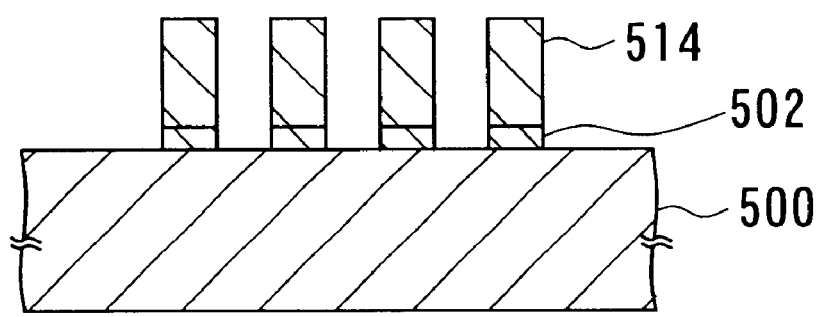
FIG. 12 is a cross section for illustrating a step that follows FIG. 11.

Next, as shown in FIG. 12, the structure is washed with water and dried, if necessary, and the resist frame 508 is removed from the substrate 500, using an organic solvent. Next, the electrode film 502 is removed through dry etching such as ion milling or reactive ion etching or wet etching, using the plating film 514 as a mask.

As thus described, the plating film 514 having a specific shape is formed, using the resist frame 508 as a frame that is formed through patterning the resist layer 504.

As described so far, the thin-film magnetic head of the embodiment comprises the read head and the write head (induction-type electromagnetic transducer). The read head has: the MR element 5; and the bottom shield layer 3 and the top shield layer (the bottom pole layer 8) for shielding the MR element 5. Portions of the bottom shield layer 3 and the top shield layer located on a side of the medium facing surface that faces toward a recording medium (the air bearing surface 30) are opposed to each other, the MR element 5 being placed between these portions.

The write head has the bottom pole layer 8 and the top pole layer (made up of the pole portion layer 41, the magnetic layer 42 and the yoke portion layer 43) that are magnetically coupled to each other, each of which includes at least one layer. The bottom pole layer 8 and the top pole layer include the pole portions that are opposed to each other and placed in regions on a side of the medium facing surface. The write head further has: the write gap layer 12 placed between the pole portion of the bottom pole layer 8 and the pole portion of the top pole layer; and the thin-film coil at least a part of which is placed between the two pole layers, the at least part of the coil being insulated from the two pole layers.

The thin-film coil has the first layer 31 and the second layer 34. The write gap layer 12 as an insulating layer is located between the first layer 31 and the second layer 34. An end of the first layer 31 and an end of the second layer 34 are connected to each other through the connecting portions 31a and 34a, and connected to the lead 44. The other end of the first layer 31 and the other end of the second layer 34 are connected to each other through the connecting portions 31b and 34b, and connected to the lead 45. According to this embodiment as thus described, the first layer 31 and the second layer 34 of the coil are connected to each other in parallel.

Figure 13:
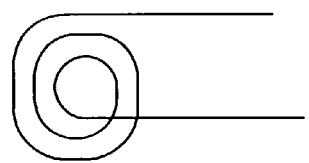
FIG. 13 briefly illustrates a one-layer coil of related art.
Figure 14:
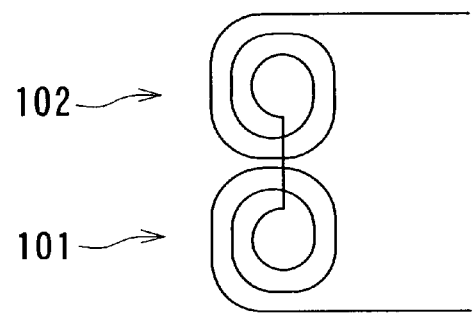
FIG. 14 illustrates the circuit configuration of a two-layer coil of related art.
Figure 15:
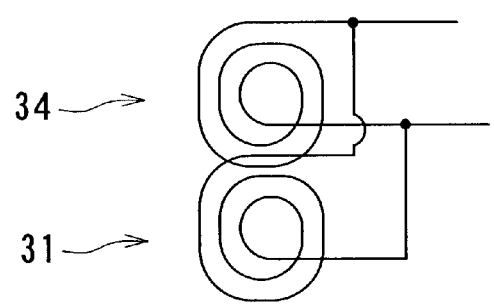
FIG. 15 illustrates the circuit configuration of the thin-film coil of the first embodiment of the invention.

Reference is now made to FIG. 13 to FIG. 15 to describe the difference in circuit configuration between the thin-film coil of the embodiment of the invention and a one-layer or two-layer coil of related art. FIG. 13 briefly illustrates the one-layer coil of related art. FIG. 14 illustrates the circuit configuration of the two-layer coil of related art. As shown in FIG. 14, a first layer 101 is connected to a second layer 102 in series. FIG. 15 illustrates the circuit configuration of the thin-film coil of the embodiment. As shown in FIG. 15, the first layer 31 is connected to the second layer 34 in parallel.

According to the embodiment, the thin-film coil is formed such that the first layer 31 is connected to the second layer 34 in parallel. As a result, the cross-sectional area of the entire coil including the first layer 31 and the second layer 34 is increased, while the coil pitch is reduced. It is thereby possible to reduce the yoke length of the write head, and to improve the high frequency characteristic of the write head and the nonlinear transition shift (hereinafter called NLTS). According to the embodiment, the magnetomotive force of the thin-film coil is improved, so that the writing capabilities such as the overwrite property are improved. According to the embodiment, the resistance of the coil is reduced, so that the coil is prevented from producing heat. Electromigration is thereby prevented.

According to the embodiment, both of the first layer 31 and the second layer 34 of the coil are formed on a flat surface. As a result, it is possible to form the first layer 31 and the second layer 34 having minute dimensions with accuracy, and to reduce the coil pitch easily.

According to the embodiment, it is not necessary that the first layer 31 and the second layer 34 are in contact with each other except at the connecting portions 31a and 34a and at the connecting portions 31b and 34b. Therefore, it is acceptable that the first layer 31 and the second layer 34 are not exactly aligned with each other. According to the embodiment, the first layer 31 and the second layer 34 may have different designs. These features of the embodiment allow the thin-film coil to be manufactured easily.

[Second Embodiment]

Figures 16A, 16B:
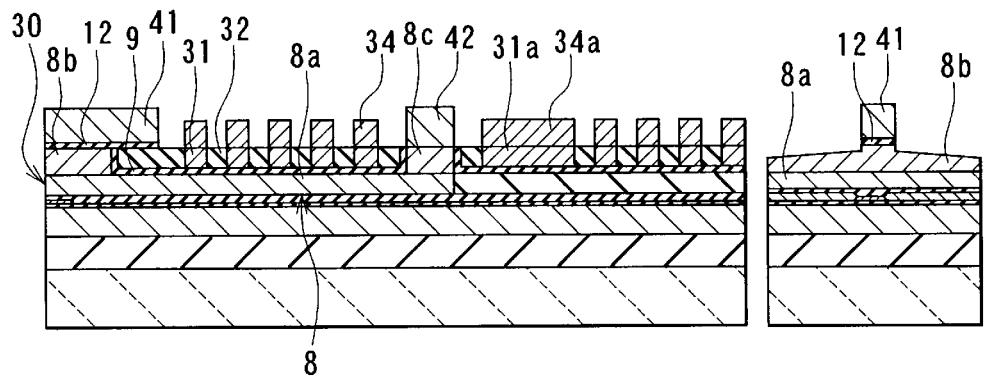
FIG. 16A and FIG. 16B are cross sections for illustrating a step of a method of manufacturing a thin-film magnetic head of a second embodiment of the invention.
Figures 17A, 17B:
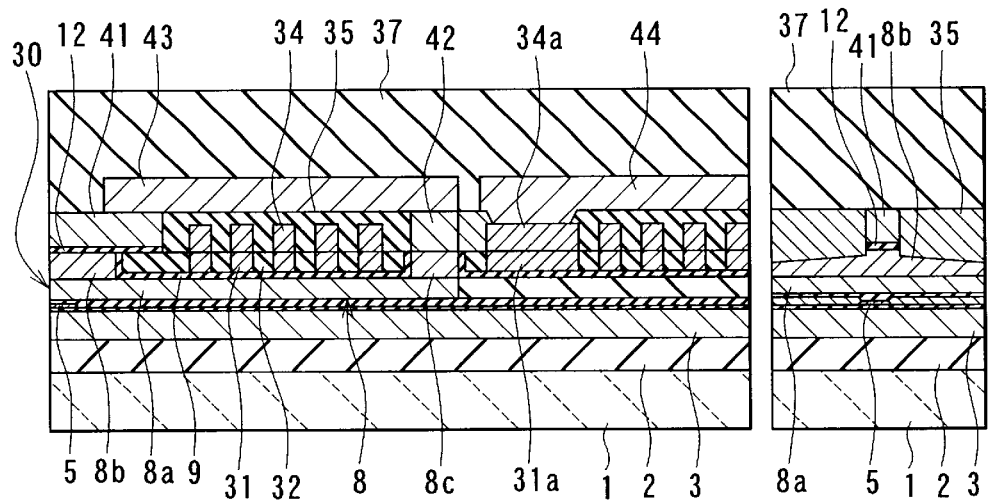
FIG. 17A and FIG. 17B are cross sections for illustrating a step that follows FIG. 16A and FIG. 16B.

Reference is now made to FIG. 16A and FIG. 17A and FIG. 16B and FIG. 17B to describe a thin-film coil and a method of manufacturing the same and a thin-film magnetic head and a method of manufacturing the same of a second embodiment of the invention. FIG. 16A and FIG. 17A are cross sections each orthogonal to the air bearing surface. FIG. 16B and FIG. 17B are cross sections of the pole portion each parallel to the air bearing surface.

The method of manufacturing the thin-film magnetic head of the second embodiment includes the steps performed until the coil insulating layer 32 that insulates the turns of the first layer 31 of the coil from one another is formed that are similar to the steps of the first embodiment, as shown in FIG. 4A and FIG. 4B.

In the following step of the method of the second embodiment, the insulating layer 32 is polished through CMP, for example, so that the second portion 8b and the third portion 8c of the bottom pole layer 8 and the first layer 31 of the coil are exposed, and the surface is flattened. The top surface of the coil insulating layer 32 is thereby flattened, together with the top surface of the first layer 31.

Next, as shown in FIG. 16A and FIG. 16B, the write gap layer 12 made of an insulating material and having a thickness of 0.2 to 0.3 µm, for example, is formed over the second portion 8b and the third portion 8c of the bottom pole layer 8, the first layer 31 of the coil, and the coil insulating layer 32.

Next, a portion of the gap layer 12 located on the region in which the third portion 8c of the bottom pole layer 8 and the first layer 31 of the coil are located is etched to make the magnetic path and to form the second layer 34 of the coil on the first layer 31.

Next, the pole portion layer 41 that has a thickness of 2 to 3 µm, for example, and makes up the pole portion of the top pole layer is formed on the write gap layer 12. The magnetic layer 42 having a thickness of 2 to 3 µm is formed on the third portion 8c of the bottom pole layer 8.

Next, the write gap layer 12 is selectively etched through dry etching, using the pole portion layer 41 of the top pole layer as a mask, as performed in the first embodiment. Furthermore, the second portion 8b of the bottom pole layer 8 is selectively etched by about 0.3 to 0.6 µm through argon ion milling, for example. A trim structure as shown in FIG. 16B is thus formed.

Next, the second layer 34 of the coil made of copper, for example, is formed by frame plating. For example, the thickness of the second layer 34 is about 1.0 to 2.0 µm and the coil pitch is 0.5 to 2.0 µm. The second layer 34 is coil-shaped and has a design similar to that of the first layer 31. In this embodiment the second layer 34 is located to touch the top surface of the first layer 31.

Next, as shown in FIG. 17A and FIG. 17B, the insulating layer 35 of alumina, for example, having a thickness of about 3 to 4 µm is formed over the entire surface. The insulating layer 35 is then polished through CMP, for example, so that the pole portion layer 41 and the magnetic layer 42 of the top pole layer are exposed, and the surface is flattened. Although the second layer 34 is not exposed in FIG. 17A and FIG. 17B, the second layer 34 may be exposed. If the second layer 34 is exposed, another insulating layer is formed on the second layer 34 and the insulating layer 35. A portion of the insulating layer 35 located on the connecting portion 34a of the second layer 34 is etched to form a contact hole.

Next, the yoke portion layer 43 that makes up the yoke portion of the top pole layer is formed for the write head on the pole portion layer 41 and the magnetic layer 42 of the top pole layer that have been flattened, and the insulating layer 35. The yoke portion layer 43 is made of a magnetic material and has a thickness of about 2 to 3 µm, for example. The yoke portion layer 43 is in contact with and magnetically coupled to the third portion 8c of the bottom pole layer 8 through the magnetic layer 42.

Next, the lead 44 made of copper, for example, is formed through a method such as frame plating on the insulating layer 35 including the portion located on the connecting portion 34a.

Next, the overcoat layer 37 of alumina, for example, having a thickness of 20 to 40 µm is formed over the entire surface. The surface of the overcoat layer 37 is flattened and pads (not shown) for electrodes are formed on the overcoat layer 37. Finally, lapping of the slider is performed to form the air bearing surface 30 of the thin-film magnetic head including the write head and the read head. The thin-film magnetic head of the embodiment is thus completed.

According to the second embodiment, the coil insulating layer 32 that insulates the turns of the first layer 31 of the coil from one another is flattened, together with the top surface of the first layer 31. In addition, the second layer 34 is located to touch the top surface of the first layer 31. As a result, the cross-sectional area of the entire coil including the first layer 31 and the second layer 34 is increased, while the coil pitch is reduced, as in the first embodiment. It is thereby possible to reduce the yoke length of the write head, and to improve the high frequency characteristic of the write head and the NLTS. According to the embodiment, the magnetomotive force of the thin-film coil is improved, so that the writing capabilities such as the overwrite property are improved. According to the embodiment, the resistance of the coil is reduced, so that the coil is prevented from producing heat. Electromigration is thereby prevented.

According to the embodiment, both of the first layer 31 and the second layer 34 of the coil are formed on a flat surface. As a result, it is possible to form the first layer 31 and the second layer 34 having minute dimensions with accuracy, and to reduce the coil pitch easily. According to the second embodiment, in particular, the second layer 34 of the coil is formed with accuracy. It is thereby possible to align the first layer 31 and the second layer 34 with accuracy. These features of the embodiment allow the thin-film coil to be manufactured easily.

The remainder of configuration and functions of the second embodiment are similar to those of the first embodiment.

The present invention is not limited to the foregoing embodiments but may be practiced in still other ways. For example, although the thin-film coil is made up of the two layers of the first layer 31 and the second layer 34 in the foregoing embodiments, the coil may be made up of three layers or more.

The invention may be applied to a thin-film magnetic head dedicated to writing that has an induction-type electromagnetic transducer only or to a thin-film magnetic head performing writing and reading through an induction-type electromagnetic transducer.

The thin-film coil and the method of manufacturing the same of the invention is not limited to the induction-type electromagnetic transducer of the thin-film magnetic head, but may be applied to an inductor, a motor, a transformer, an actuator and so on that include thin-film coils.

According to the first thin-film coil or the method of manufacturing the same of the invention described so far, an insulating layer is located between the first and second patterned conductor layers. In addition, the first and second patterned conductor layers are connected to each other in parallel. As a result, the thin-film coil having a large cross-sectional area and a small coil pitch is easily manufactured.

According to the second thin-film coil or the method of manufacturing the same of the invention, the coil insulating layer that insulates the turns of the first patterned conductor layer from one another is flattened, together with one of the surfaces of the first patterned conductor layer. In addition, the second patterned conductor layer is located to touch the one of the surfaces of the first patterned conductor layer. As a result, the thin-film coil having a large cross-sectional area and a small coil pitch is easily manufactured.

According to the first thin-film magnetic head or the method of manufacturing the same of the invention, the insulating layer is located between the first and second patterned conductor layers. In addition, the first and second patterned conductor layers are connected to each other in parallel. As a result, the thin-film coil having a large cross-sectional area and a small coil pitch is easily manufactured.

According to the second thin-film magnetic head or the method of manufacturing the same of the invention, the coil insulating layer that insulates the turns of the first patterned conductor layer from one another is flattened, together with one of the surfaces of the first patterned conductor layer. In addition, the second patterned conductor layer is located to touch the one of the surfaces of the first patterned conductor layer. As a result, the thin-film coil having a large cross-sectional area and a small coil pitch is easily manufactured.

Obviously many modifications and variations of the present invention are possible in the light of the above teachings. It is therefore to be understood that within the scope of the appended claims the invention may be practiced otherwise than as specifically described.

What is claimed is:

1. A thin-film coil comprising:
a coil-shaped first patterned conductor layer;
a first insulating layer that fills a space between turns of the first patterned conductor layer and that is flattened together with one of surfaces of the first patterned conductor layer so that the first insulating layer and both upper and lower surfaces of the first patterned conductor layer are coplanar;
a second insulating layer located on the first patterned conductor layer and the first insulating layer;
a coil-shaped second patterned conductor layer located on the second insulating layer;
a first connecting portion connecting one of ends of the first patterned conductor layer to one of ends of the second patterned conductor layer; and
a second connecting portion connecting the other of the ends of the first patterned conductor layer to the other of the ends of the second patterned conductor layer.

2. A thin-film coil comprising:
a coil-shaped first patterned conductor layer;
a first coil insulating layer that fills a space between turns of the first patterned conductor layer and that is flattened together with one of surfaces of the first patterned conductor layer so that the first coil insulating layer and both upper and lower surfaces of the first patterned conductor layer are coplanar;
a coil-shaped second patterned conductor layer located to touch the one of the surfaces of the first patterned conductor layer; and
a second coil insulating layer that covers a surface of the first coil insulating layer and a surface of the second patterned conductor layer.

3. A thin-film magnetic head comprising: a medium facing surface that faces toward a recording medium; a first magnetic layer and a second magnetic layer magnetically coupled to each other and including magnetic pole portions that are opposed to each other and placed in regions of the magnetic layers on a side of the medium facing surface, each of the magnetic layers including at least one layer; a gap layer provided between the pole portions of the first and second magnetic layers; and a thin-film coil at least a part of which is placed between the first and second magnetic layers, the at least part of the coil being insulated from the first and second magnetic layers; wherein the thin-film coil incorporates:

a coil-shaped first patterned conductor layer;

a first insulating layer that fills a space between turns of the first patterned conductor layer and that is flattened together with one of surfaces of the first patterned conductor layer so that the first insulating layer and both upper and lower surfaces of the first patterned conductor layer are coplanar;

a second insulating layer located on the first patterned conductor layer and the first insulating layer;

a coil-shaped second patterned conductor layer located on the second insulating layer;

a first connecting portion connecting one of ends of the first patterned conductor layer to one of ends of the second patterned conductor layer; and a second connecting portion connecting the other of the ends of the first patterned conductor layer to the other of the ends of the second patterned conductor layer.

4. A thin-film magnetic head comprising: a medium facing surface that faces toward a recording medium; a first magnetic layer and a second magnetic layer magnetically coupled to each other and including magnetic pole portions that are opposed to each other and placed in regions of the magnetic layers on a side of the medium facing surface, each of the magnetic layers including at least one layer; a gap layer provided between the pole portions of the first and second magnetic layers; and a thin-film coil at least a part of which is placed between the first and second magnetic layers, the at least part of the coil being insulated from the first and second magnetic layers; the thin-film coil incorporating:

a coil-shaped first patterned conductor layer;

a first coil insulating layer that fills a space between turns of the first patterned conductor layer and that is flattened together with one of surfaces of the first patterned conductor layer so that the first coil insulating layer and both upper and lower surfaces of the first patterned conductor layer are coplanar;

a coil-shaped second patterned conductor layer located to touch the one of the surfaces of the first patterned conductor layer; and a second coil insulating layer that covers a surface of the first coil insulating layer and a surface of the second patterned conductor layer.

* * * * *